US010692872B2

(12) United States Patent
Varghese et al.

(10) Patent No.: US 10,692,872 B2
(45) Date of Patent: Jun. 23, 2020

(54) DEVICE STRUCTURE FOR FORMING SEMICONDUCTOR DEVICE HAVING ANGLED CONTACTS

(71) Applicant: Varian Semiconductor Equipment Associates, Inc., Gloucester, MA (US)

(72) Inventors: Sony Varghese, Manchester, MA (US); Anthony Renau, West Newbury, MA (US); Morgan Evans, Manchester, MA (US); John Hautala, Beverly, MA (US); Joe Olson, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 15/839,260

(22) Filed: Dec. 12, 2017

(65) Prior Publication Data

US 2019/0181144 A1    Jun. 13, 2019

(51) Int. Cl.
*H01L 27/108* (2006.01)

(52) U.S. Cl.
CPC .. *H01L 27/10855* (2013.01); *H01L 27/10814* (2013.01)

(58) Field of Classification Search
CPC ............... H01L 27/10855; H01L 27/10814
USPC ........................................................ 257/296
See application file for complete search history.

(56) References Cited

U.S. PATENT DOCUMENTS

| | | | |
|---|---|---|---|
| 6,333,535 B2 * | 12/2001 | Okumura | H01L 21/76877 257/306 |
| 6,548,853 B1 * | 4/2003 | Hwang | H01L 27/10817 257/306 |
| 6,979,614 B2 | 12/2005 | Park | |
| 7,994,561 B2 * | 8/2011 | Kim | H01L 28/91 257/307 |
| 2004/0127050 A1 * | 7/2004 | Park | H01L 21/76895 438/692 |
| 2004/0217407 A1 * | 11/2004 | Cho | H01L 27/10855 257/306 |
| 2004/0266101 A1 * | 12/2004 | Park | H01L 27/10855 438/253 |
| 2005/0106808 A1 * | 5/2005 | Yu | H01L 27/10817 438/253 |
| 2005/0161720 A1 * | 7/2005 | Park | H01L 27/10817 257/296 |

(Continued)

FOREIGN PATENT DOCUMENTS

| | | |
|---|---|---|
| KR | 10-0360151 B1 | 11/2002 |
| KR | 10-2005-0116314 A | 12/2005 |
| KR | 10-1168559 B1 | 7/2012 |

OTHER PUBLICATIONS

International Search Report and Written Opinion dated Mar. 18, 2019 for PCT/US2018/062555 filed Nov. 27, 2018.

*Primary Examiner* — Mohammad M Hoque

(57) ABSTRACT

A memory device may include an active device region, disposed at least partially in a first level. The memory device may include a storage capacitor, disposed at least partially in a second level, above the first level, wherein the first level and the second level are parallel to a substrate plane. The memory device may also include a contact via, the contact via extending between the storage capacitor and the active device region, and defining a non-zero angle of inclination with respect to a perpendicular to the substrate plane.

12 Claims, 6 Drawing Sheets

(56) References Cited

U.S. PATENT DOCUMENTS

| | | | | |
|---|---|---|---|---|
| 2005/0224854 A1* | 10/2005 | Park | .................. | H01L 21/76895 |
| | | | | 257/296 |
| 2006/0022256 A1* | 2/2006 | Lee | .................. | H01L 21/76838 |
| | | | | 257/315 |
| 2006/0292812 A1* | 12/2006 | Jung | .................. | H01L 27/0207 |
| | | | | 438/381 |
| 2007/0241380 A1* | 10/2007 | Hasunuma | .......... | H01L 27/0207 |
| | | | | 257/296 |
| 2008/0017908 A1* | 1/2008 | Cho | .................. | H01L 27/10817 |
| | | | | 257/311 |
| 2008/0173979 A1* | 7/2008 | Kim | .................. | H01L 23/5226 |
| | | | | 257/532 |
| 2008/0210999 A1* | 9/2008 | Horikawa | ......... | H01L 27/10814 |
| | | | | 257/296 |
| 2009/0021889 A1* | 1/2009 | Tanioku | ............... | H01G 4/1218 |
| | | | | 361/321.5 |
| 2009/0072287 A1* | 3/2009 | Noda | ................ | H01L 27/11502 |
| | | | | 257/295 |
| 2011/0024870 A1* | 2/2011 | Lee | .................. | H01L 27/10882 |
| | | | | 257/506 |
| 2012/0112269 A1* | 5/2012 | Kim | .................. | H01L 21/76897 |
| | | | | 257/330 |
| 2015/0124521 A1* | 5/2015 | Lim | .................. | H01L 27/10814 |
| | | | | 365/149 |
| 2015/0255465 A1* | 9/2015 | Yokomichi | ....... | H01L 27/10814 |
| | | | | 257/754 |
| 2017/0278847 A1* | 9/2017 | Kim | ..................... | H01L 23/528 |

* cited by examiner

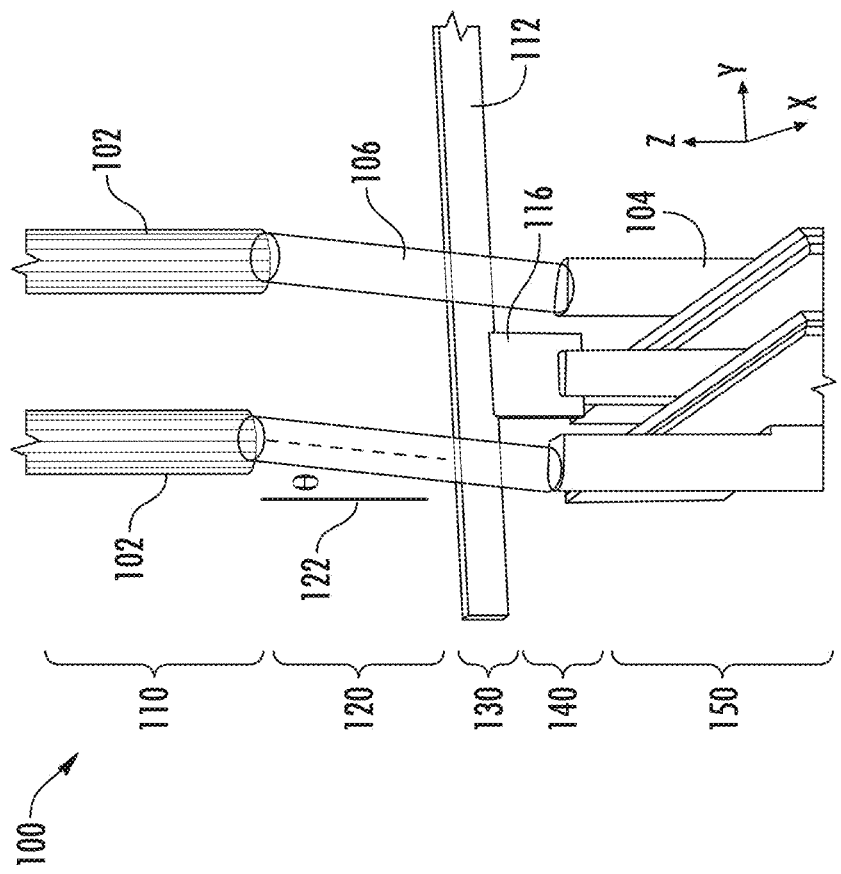
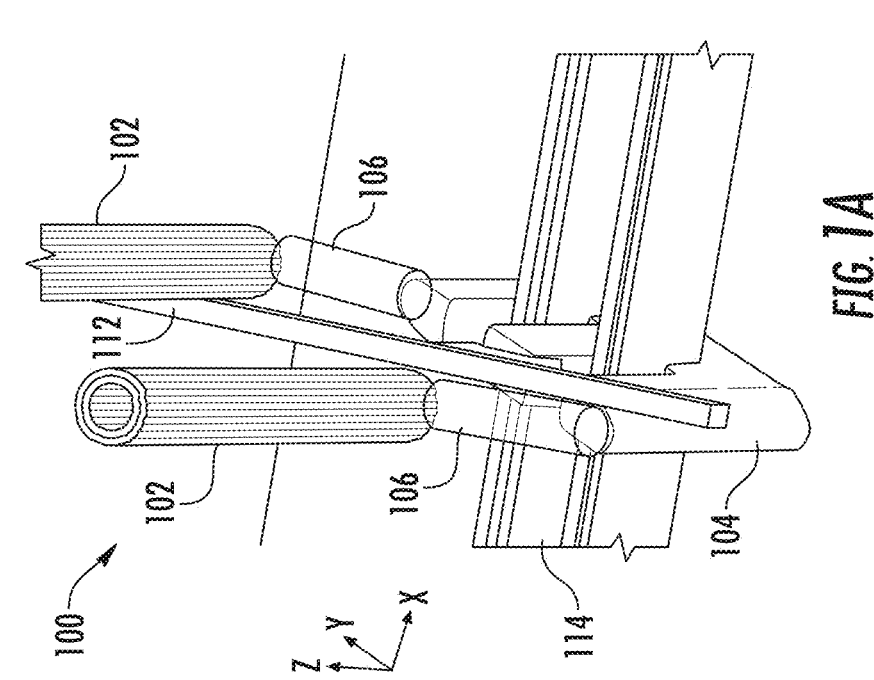

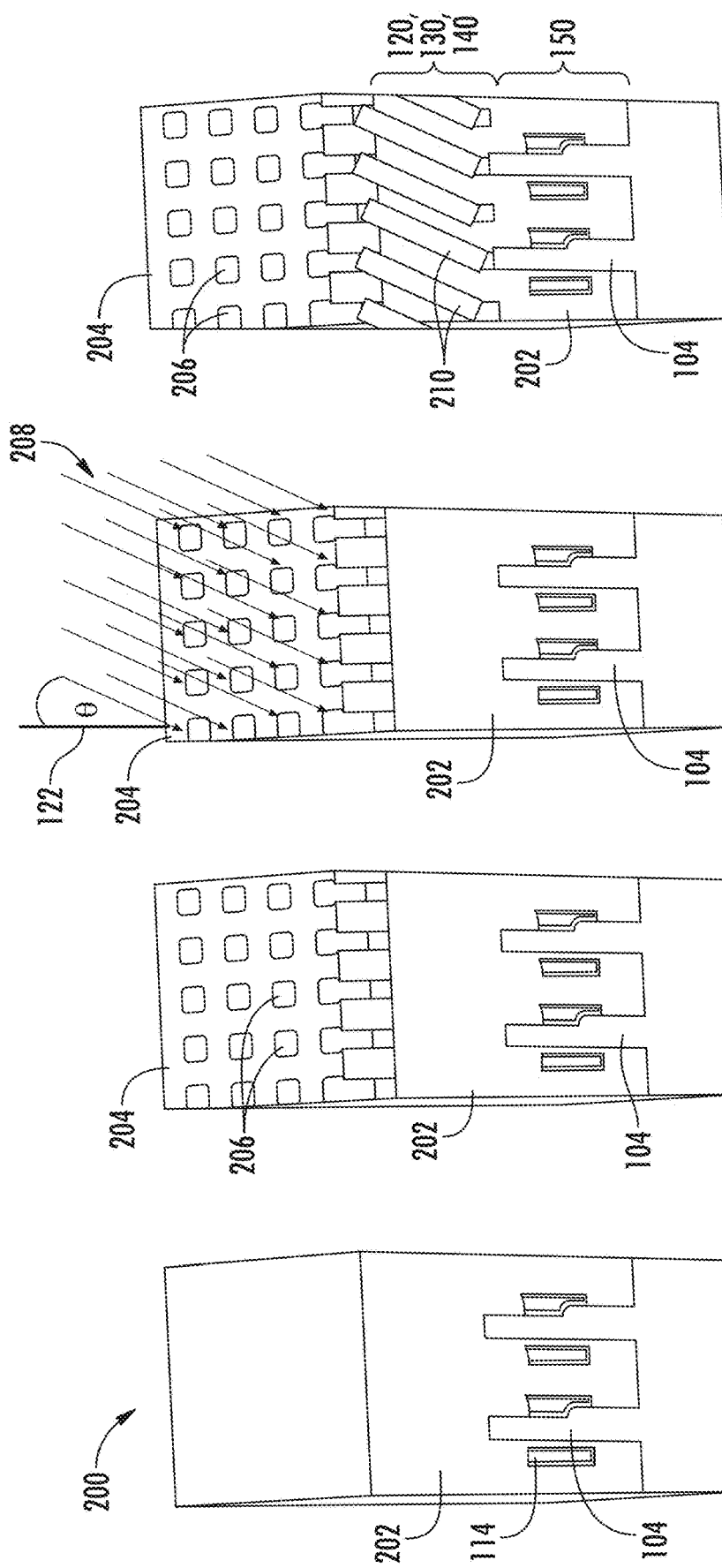

DEVICE STRUCTURE FOR FORMING SEMICONDUCTOR DEVICE HAVING ANGLED CONTACTS

FIELD

The present embodiments relate to semiconductor device structures, and more particularly, to structures and processing for memory devices including dynamic random access devices.

BACKGROUND

As semiconductor devices, including logic devices and memory devices, such as dynamic random-access memory (DRAM) devices, scale to smaller dimensions, device patterning increasingly limits the ability to harness the improvements potentially resulting from smaller size. For example, in present day DRAM devices, known architectures include so-called $8F^2$ structure and $6F^2$ structure (architecture) among others. While $6F^2$ architecture provides a higher device density and greater speed than $8F^2$ architecture, the ability to form memory devices having appropriate properties is compromised, in part because of patterning problems, such as overlay. As an example, as DRAM cell size shrinks, the $6F^2$ architecture causes difficulty in forming electrical contact between an access transistor and structures lying above the access transistor, such as a bit line or a storage node capacitor. For example, the storage node capacitor may be formed at a much higher level than the level containing the access transistor. To form an electrical connection between the storage capacitor and access transistor, a structure such as a via may need to be formed, where the via traverses multiple levels including the bit line level and bit line contact level. Because of crowding between bit lines, word lines, and active area forming the access transistors, the contact via may be unable to properly contact the active area of the transistor. For example, to avoid overlapping with a bit line, the contact via may be placed in a position where overlay between the contact via and the storage capacitor, as well as overlay between the contact via and active area of the access transistor may be less than ideal.

With respect to these and other considerations, the present disclosure is provided.

BRIEF SUMMARY

In one embodiment, a memory device may include an active device region, disposed at least partially in a first level. The memory device may include a storage capacitor, disposed at least partially in a second level, above the first level, wherein the first level and the second level are parallel to a substrate plane. The memory device may also include a contact via, the contact via extending between the storage capacitor and the active device region, and defining a non-zero angle of inclination with respect to a perpendicular to the substrate plane.

In another embodiment, a method of fabricating a semiconductor device, may include forming an active device region in a first level of the semiconductor device. The method may further include forming a contact via, the contact via contacting the active device region, the contact via forming a non-zero angle of inclination with respect to a perpendicular to a substrate plane. The method may also include forming a storage capacitor, at least partially in a second level of the semiconductor device, above the first level, wherein the storage capacitor contacts the contact via.

In another embodiment, a device structure may include a first device, disposed in a first device level, a second device, disposed in second device level, above the first device level. The device structure may also include a contact via, the contact via extending between the first device and the second device, and defining a non-zero angle of inclination with respect to a perpendicular to a substrate plane.

BRIEF DESCRIPTION OF THE DRAWINGS

FIG. 1A shows a top perspective view device structure, according to embodiments of the disclosure;

FIG. 1B shows a top perspective view of the device structure of FIG. 1B, slightly rotated from the perspective of FIG. 1B;

FIG. 2A to FIG. 2D show a device structure at various stages of fabrication, according to some embodiments of the disclosure;

DETAILED DESCRIPTION

Figure 1D:
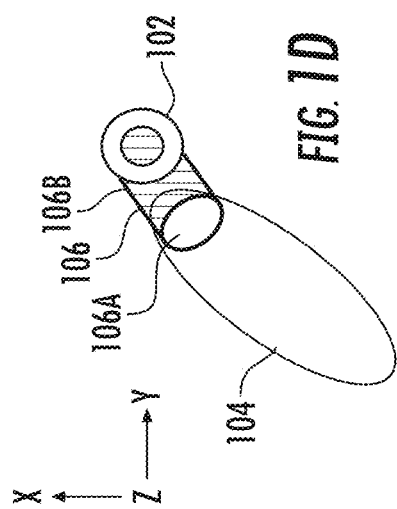
FIG. 1D shows a top plan view of a portion of the device structure of FIG. 1A.

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

The present embodiments provide novel techniques and substrate structures to form devices, including memory devices, formed in a semiconductor substrate. These techniques may especially be applicable to formation of DRAM devices, while other devices may also be formed according to the embodiments of the disclosure. These other devices may include NAND devices, including 3DNAND devices, NOR devices, X point memories and logic devices, as well as packaging structures, where a common feature is the linking of different components in different levels of a given device using angled vias. In different embodiments, the angled vias may be constructed within dielectric material, polysilicon, or within silicon, such as through silicon vias (TSV). The embodiments are not limited in this context. Various non-limiting embodiments are particularly useful for implementation where a component in a first level of a device, such as a DRAM storage capacitor, is linked to another component in a different level of the device, such as an access transistor.

According to various embodiments a memory device may include active device region(s) located in an active level, and a storage capacitor, located in a capacitor level, above the active level. Advantageously, as discussed below angled contact via(s) are also provided to form angled contacts extending between a storage capacitor(s) and the active device region, where the angled contact via defines a non-zero angle of inclination with respect to a perpendicular to a device plane, as defined by the active level and storage capacitor level. As discussed below, this device structure and related device structures may improve device performance by facilitating better overlap between devices contacting one another other at different levels.

Turning now to FIG. 1A, and FIG. 1B there are shown two top perspective views of a device structure 100, according to embodiments of the disclosure. The device structure 100 illustrates several components of a memory device, such as a DRAM device. The device structure 100 includes a set of storage capacitors, shown as storage capacitors 102, arranged in a storage capacitor level, shown as level 110 (see FIG. 1B for more definition of different levels of the device structure 100). As used herein, a "level" may refer to a portion of a device, where different levels are built one upon another as a device is fabricated, such as by using a different masking operation for a different level. A "substrate plane" as used herein may refer to the X-Y plane of the Cartesian coordinate system shown. During fabrication of a device, the different levels are generally sequentially built upon one another proceeding along the Z-axis. Thus, a lower level may be built generally lower on the Z-axis, while a higher level may be built higher along the Z-axis, as shown in FIG. 1B. Notably, different structures constructed from different mask levels may reside or overlap in the same physical level along the Z-axis, as known in the art.

The device structure 100 further includes an active device region 104, where the active device region 104 is disposed in an active device level, shown as level 150. The active device region 104 may represent an upper surface of a semiconductor structure, such as monocrystalline silicon, to serve as an active transistor component, such as a source/drain (S/D) structure of a transistor. A gate structure 114 is also shown, and may function to turn on or off a transistor. The device structure 100 further includes a digit line 112, disposed in a digit line level, shown as level 130, where the digit line 112 forms electrical connection with the gate structure 114 using a digit line contact 116, disposed in a contact level 140. The device structure 100 further includes a set of vias, shown as contact vias 106, where a contact via 106 extends in a contact via level 120 between a storage capacitor 102 and the active device region 104. Notably, the contact via 106 may extend through multiple levels. In the example of FIG. 1A and FIG. 1B, two storage capacitors are shown, where a storage capacitor 102 is connected to either a source region or a drain region of the active device region 104. Notably, the two storage capacitors shown may contact two different transistors, formed using the active device region 104.

The device structure 100 further includes a contact via 106 extending between the storage capacitor 102 and the active device region 104. The contact via 106 may generally include an electrically conductive material to form an electrically conductive path between the active device region 104 and storage capacitor 102. When a signal is sent along the digit line 112, the gate structure 114 may be activated by the signal passing via the digit line contact 116, in a manner turning on a transistor formed by the active device region 104. When the transistor turns on, electrical charge may flow to or from the storage capacitor 102 through the contact via 106, as known in the art.

Figure 1E:
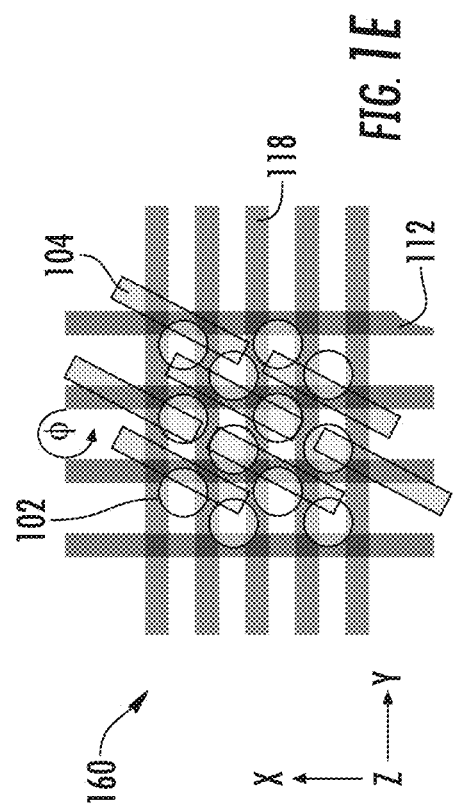
FIG. 1E shows a top plan view of a device structure according to further embodiments of the disclosure.
Figure 1C:
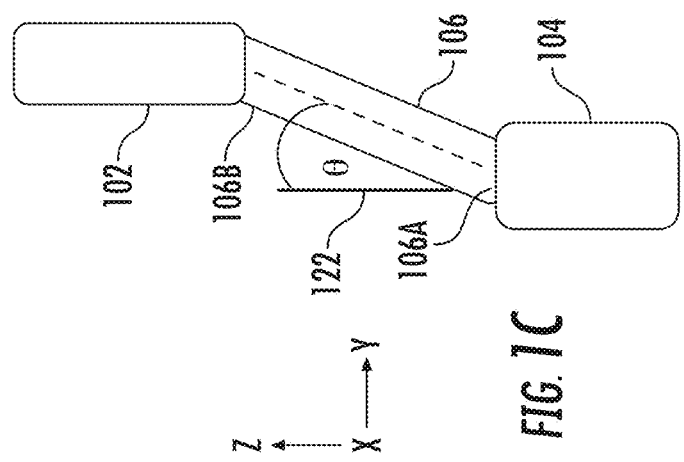
FIG. 1C depicts a side view of a portion of the device structure of FIG. 1A.

As shown more clearly in FIG. 1C, the contact via 106 is angled, meaning the contact via 106 defines a non-zero angle of inclination, shown as θ, with respect to a perpendicular to 122 the substrate plane, defined in this case as the X-Z plane. This structure contrasts with known DRAM contact vias extending vertically between different levels, meaning at a zero angle of inclination with respect to the perpendicular 122.

FIG. 1D shows a top plan view of a portion of the device structure 100 of FIG. 1A. As shown in FIG. 1C and FIG. 1D, a bottom portion 106A of the contact via 106 overlaps with the active device region 104. In some embodiments, the bottom portion 106A may overlap in an entirety with the active device region 104. As further depicted in FIG. 1C and FIG. 1D, the top portion 106B of the contact via 106 overlaps the storage capacitor 102. In some embodiments, the top portion 106B may overlap in an entirety with the active device region 104.

As shown in FIG. 1D, the contact via 106 allows the storage capacitor 102 to be shifted within the X-Y plane with respect to the active device region 104. For example, in some embodiments as reflected in FIG. 1D the storage capacitor 102 may have zero overlap with the active area 104. More precisely, while disposed in a higher level, the storage capacitor 102 does not appear to overlap the active device region 104 within the X-Y plane from a plan view perspective. In this manner, the contact via 106 facilitates formation of superior electrical contact between structures disposed in different levels, where the structures are not aligned to one another with respect to the position in a substrate plane, such as the X-Y plane. This geometry differs from the geometry of known DRAM devices where contact vias are aligned vertically between levels, meaning along a perpendicular to a substrate plane or device plane, imposing constraints where complete overlap between storage capacitor and contact via or between contact via and active area may not be possible.

FIG. 1E provides a top plan view of an implementation of a device structure 160 according to some embodiments of the disclosure. The device structure 160 is implemented in a $6F^2$ DRAM architecture, where the active area 104 is arranged as an array of elongated regions, defining an angle φ with respect to the digit lines 112 and word lines 118. In the view of FIG. 1E, the structures shown are disposed in the level 110, level 130, and level 150. The contact vias 106 are not explicitly depicted. In addition, the word lines 118 are disposed in a level above level 110. As shown, the storage capacitors 102 are arranged in a two-dimensional array. Notably, the storage capacitors 102 overlap the digit lines 112 in the X-Y plane. At the same time, as detailed above, the contact vias 106 may completely overlap (in top portion 106B) with the storage capacitors 102, as well as with the active device regions 104. Thus, the contact vias 106, by virtue of being arranged at a non-zero angle of inclination with respect to perpendicular, provide a large degree of freedom in placement of the storage capacitors 102 within the X-Y plane, with respect to structures in other levels. In other words, the storage capacitors 102 may be aligned directly on top of other structures in levels intermediate between the level of active device regions 104 (level 150) and the storage capacitor level (level 110), creating an overlap in the X-Y plane. This geometry is permitted since the contact vias 106, used to connect the storage capacitors 102 and active device regions 104, may be angled to avoid contact with the other structures.

FIG. 2A to FIG. 2D show a device structure 200 at various stages of fabrication, according to some embodiments of the disclosure. The sequence shown begins at a stage of fabrication of a memory device in FIG. 2A, where active device regions and transistor gates have been fabricated. The sequence of FIG. 2A to FIG. 2D proceeds through formation of angled vias, and ends before the formation of storage capacitors. In FIG. 2A, an insulator 202 is disposed over the active device regions 104 and gate structures 114. The insulator 202 provides a medium for formation of vias, as described below.

Turning to FIG. 2B, there is shown an instance after formation of a mask 204 on the insulator 202. The mask 204 is patterned in a manner to generate an array of openings, shown as openings 206. A given opening is used to form a contact via, as detailed below. According to various embodiments, the mask 204 may include a combination of at least one layer, such as known layers used for patterning, including, but not limited to, nitride, carbon, oxide, or resist. In various non-limiting embodiments, the thickness of the mask 204 may range from 10 nm to 100 nm. The mask 104 may be generally made of a different material than the insulator 202. The mask 204 may accordingly be used to transfer the pattern of openings 206 into insulator 202.

Turning now to FIG. 2C, there is shown a subsequent instance where angled ions 208 are directed to the mask 104. As detailed below, the angled ions 208 may be provided in a directional reactive ion beam etching operation, designed to etch the insulator 202. The etching recipe including the angled ions 208 may be designed to selectively etch the insulator 202 with respect to the mask 104. In some non-limiting embodiments, the etch selectivity may vary between approximately 5/1 and 20/1, meaning the etch recipe including the angled ions 208 etches the insulator 202 five times to twenty times faster than the mask 204 is etched.

Turning now to FIG. 2D there is shown an instance after the completion of the directional reactive ion beam etching operation of FIG. 2C. At this stage of device formation, angled contact vias, shown as contact vias 210, have been fabricated within the insulator 202. The contact vias 210 extend at a non-zero angle of inclination with respect to the perpendicular 122 to the X-Y plane. The contact vias 210 extend so as to expose the active device regions 104. Subsequently to the operation of FIG. 2D, a set of storage capacitors may be formed on top of the contact vias 210. While not shown, digit lines may extend within the insulator 202, to form contacts with the gate structures 114, as described above.

Figure 3A:
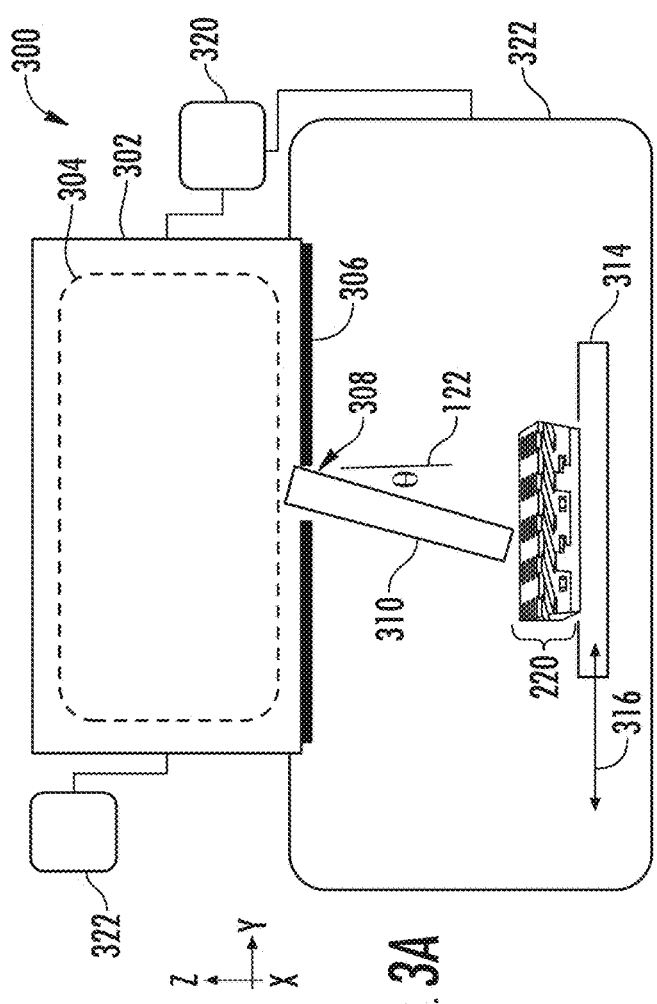
FIG. 3A shows a side view of an apparatus according to embodiments of the disclosure.

Turning now to FIG. 3A, there is shown a processing apparatus 300, depicted in schematic form. The processing apparatus 300 represents a processing apparatus for etching portions of a substrate, such as an insulator layer. The processing apparatus 300 may be a plasma based processing system having a plasma chamber 302 for generating a plasma 304 therein by any convenient method as known in the art. An extraction plate 306 may be provided as shown, having an extraction aperture 308, where a selective etching may be performed to reactively etch an insulator layer with respect to a mask material. A substrate 220, including, for example, the aforementioned structure, device structure 200, is disposed in the process chamber 322. A substrate plane of the substrate 220 is represented by the X-Y plane of the Cartesian coordinate system shown, while a perpendicular to the plane of the substrate 220 lies along the Z-axis (Z-direction).

During an angled reactive ion beam etching operation, an ion beam 310 is extracted through the extraction aperture 308 as shown. As shown in FIG. 3A, the trajectory of the ion beam 310 forms a non-zero angle of incidence with respect to the perpendicular 122, shown as θ. The trajectories of ions within the ion beam 310 may be mutually parallel to one another or may lie within a narrow angular range, such as within 10 degrees of one another or less. Thus, the value of θ may represent an average value of incidence angle where the individually trajectories vary up to several degrees from the average value. The ion beam 310 may be extracted when a voltage difference is applied using bias supply 320 between the plasma chamber 302 and substrate 220 as in known systems. The bias supply 320 may be coupled to the process chamber 322, for example, where the process chamber 322 and substrate 220 are held at the same potential. In various embodiments, the ion beam 310 may be extracted as a continuous beam or as a pulsed ion beam as in known systems. For example, the bias supply 320 may be configured to supply a voltage difference between plasma chamber 302 and process chamber 322, as a pulsed DC voltage, where the voltage, pulse frequency, and duty cycle of the pulsed voltage may be independently adjusted from one another.

Figure 3B:
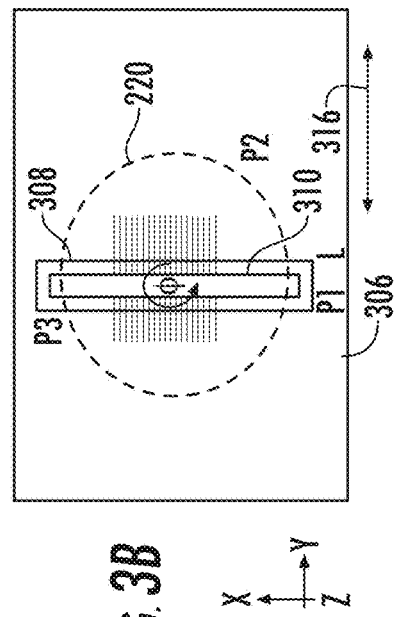
FIG. 3B shows a top plan view of a portion of the apparatus of FIG. 3A.

In various embodiments, for example, the ion beam 310 may be provided as a ribbon ion beam having a long axis extending along the X-direction of the Cartesian coordinate system shown in FIG. 3B. As further shown in FIG. 3C, during the operation of FIG. 3A, the mask 204 may be oriented in a manner where the openings 206 are arranged in rows, generally aligned with rows of the active device regions 104, as viewed in the X-Y plane. As shown, the rows of the openings 206 may be displaced in the X-Y plane with respect to the rows of the active device regions 104. The projection in the X-Y plane of the trajectories of ions of the ion beam 310 is shown by the arrows. By scanning a substrate stage 314 including substrate 220 with respect to the extraction aperture 308, and thus with respect to the ion beam 310 along the scan direction 316, the ion beam 310 may etch a set of angled vias oriented at a non-zero angle of inclination with respect to the perpendicular 122. The ion beam 310 may be composed of any convenient gas mixture, including inert gas, reactive gas, and may be provided in conjunction with other gaseous species in some embodiments. In particular embodiments, the ion beam 310 and other reactive species may be provided as an etch recipe to the substrate 220 so as to perform a directed reactive ion etching of targeted sidewalls of the substrate 220. Such an etch recipe may use known reactive ion etch chemistries for etching materials such as oxide or other material, as known in the art. The etch recipe may be selective with respect to the material of the mask 204, so as to remove the insulator 202, while not etching the mask 204, or etching the mask 204 to a lesser extent.

In this example of FIG. 3B, the substrate 220 is a circular wafer, such as a silicon wafer, the extraction aperture 308 is an elongated aperture, having an elongated shape. The ion beam 310 is provided as a ribbon ion beam extending to a beam width along the X-direction, where the beam width is adequate to expose an entire width of the substrate 101, even at the widest part along the X-direction. Exemplary beam widths may be in the range of 10 cm, 20 cm, 30 cm, or more while exemplary beam lengths along the Y-direction may be in the range of 3 mm, 5 mm, 10 mm, or 20 mm. The embodiments are not limited in this context.

As also indicated in FIG. 3B, the substrate 220 may be scanned in the scan direction 316, where the scan direction 316 lies in the X-Y plane, such as along the Y-direction. Notably, the scan direction 316 may represent the scanning of substrate 220 in two opposing (180 degrees) directions along the Y-direction, or just a scan toward the left or a scan toward the right. As shown in FIG. 3B, the long axis of ion beam 310 extends along the X-direction, perpendicularly to the scan direction 316. Accordingly, an entirety of the substrate 220 may be exposed to the ion beam 310 when scanning of the substrate 220 takes place along a scan direction 316 to an adequate length from a left side to right side of substrate 220 as shown in FIG. 3B.

Figure 3C:
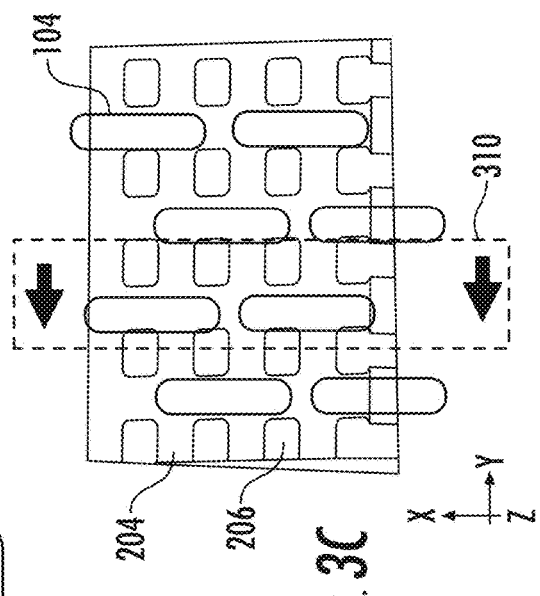
FIG. 3C shows an enlarged top plan view of showing details of the mask geometry of FIG. 3B.

As also shown in FIG. 3B and FIG. 3C, the exposure of substrate 220 to the ion beam 310 may take place when the substrate 220 is scanned while disposed at a first rotational position as indicated by the position P1 on substrate 220 being located under the location L on the extraction plate 306. For example, the position P1 may correspond to the position of a notch or a flat on a wafer. In accordance with various embodiments, at least one scan may be performed along the scan direction 316 to form the contact vias 106, while the substrate 220 is positioned at a fixed rotational position. Because the ion beam 310 forms a non-zero angle of incidence with respect to the perpendicular 122, etching of the contact vias 106 may proceed in a manner generating vias having an axis forming an angle of inclination oriented generally along the non-zero angle of incidence, also shown as $\theta$ in the figures depicting contact vias. In accordance with various non-limiting embodiments, the value of $\theta$ may be less than 15 degrees, and in particular embodiments may lie between 5 degrees and 10 degrees. The exact value of $\theta$ may be chosen according to the designed amount of displacement (in the X-Y plane) of a storage capacitor 102 with respect to the active device regions 104. Accordingly, a device structure, such as shown in FIG. 2D may be generated, where a given active device in level 150 to be connected to a given storage capacitor (in level 110) is displaced to the left in the figure.

Figure 4:
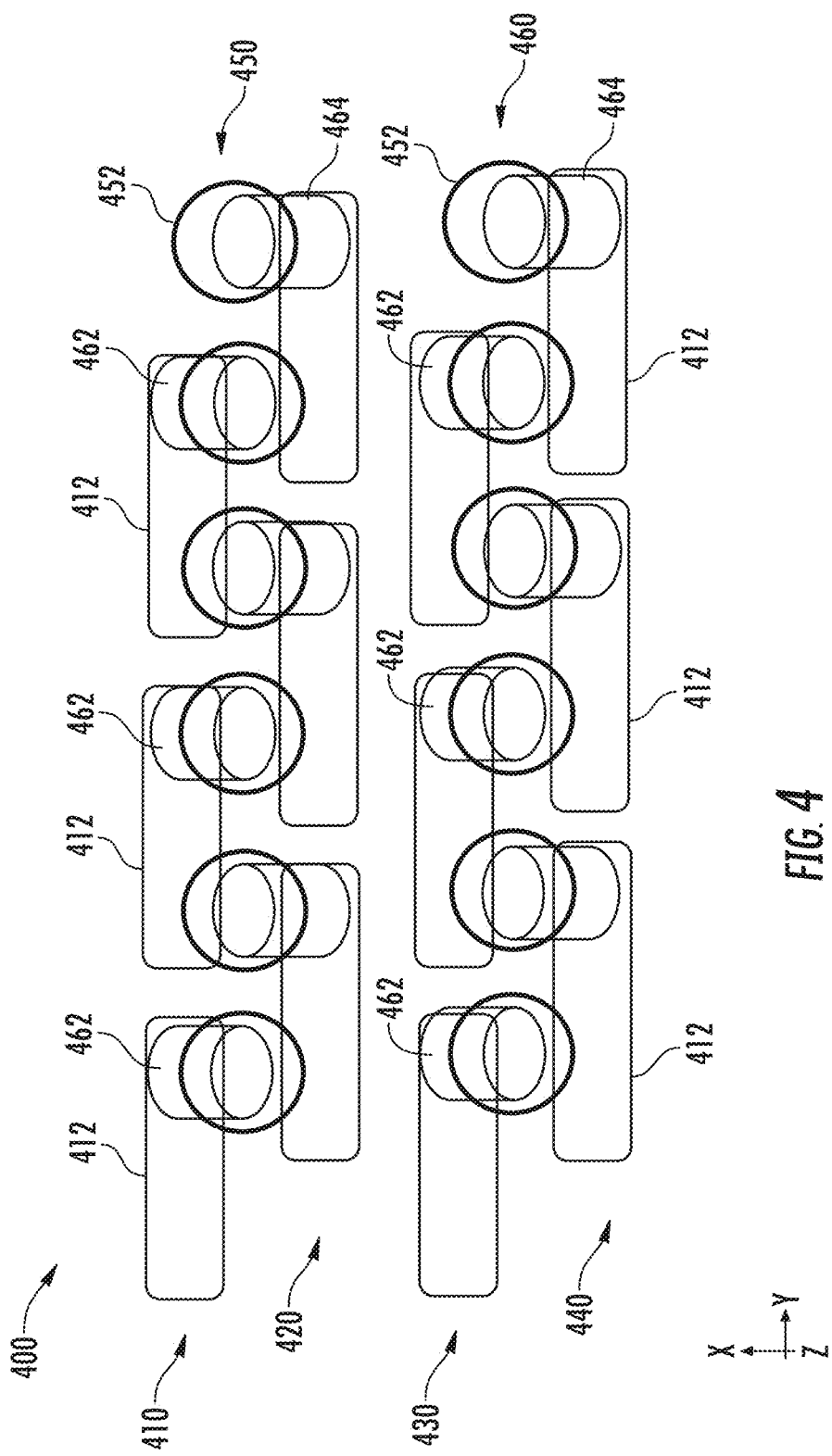
FIG. 4 shows a top plan view of a device structure, according to embodiments of the disclosure.

In additional embodiments of a method and device structure, set of storage capacitors may be arranged in arrays where different capacitors are angled in different directions. FIG. 4 shows a top plan view of a device structure 400, according to embodiments of the disclosure. The view of FIG. 4 shows several device levels, as discussed above. The device structure 400 includes a set of active areas for formation of transistor devices, shown as active areas 412. The active areas 412, are arranged in various rows, shown as active area row 410, active area row 420, active area row 430, and active area row 440. As further illustrated in FIG. 4, the device structure 400 includes various rows of capacitors 452, including capacitor row 450 and capacitor row 460, where the capacitor rows are spaced between the active areas 412, with some overlap, as shown. Within capacitor row 450, the capacitors 452 are alternately connected to an active area 412 in active area row 410 or active area row 420, as shown. Similarly, within capacitor row 460, the capacitors 452 are alternately connected to an active area 412 in active area row 430 or active area row 440, as shown. This staggered configuration of connection is realized by the provision of first contact vias 462, angled in a first direction, and second contact vias 464, angled in a second direction.

To generate the structure of FIG. 4, the processing apparatus 300 may be operated in the following manner. As an example, while the ion beam 310 is arranged at a fixed non-zero angle of incidence with respect to the perpendicular 122, in a first set of scans, the substrate 220 may be maintained at a first rotational position, such as shown in FIG. 3B, to form a first set of contact vias, as generally shown in FIG. 2D. In a second set of scans, the ion beam 310 may be arranged at the same fixed-non-zero angle of incidence after rotation of the substrate 220 through a twist angle $\phi$ of 180 degrees, wherein position P3 is located adjacent L. In this manner, a second set contact vias may be formed defining a non-zero angle of incidence with respect to the perpendicular 122 having the same absolute value as the first set of contact vias, while forming a mirror image of the first set of contact vias with respect to the X-Z plane. This structure allows further design flexibility in terms of relative placement of capacitors with respect to underlying active regions in devices, such as DRAM devices.

Figure 5:
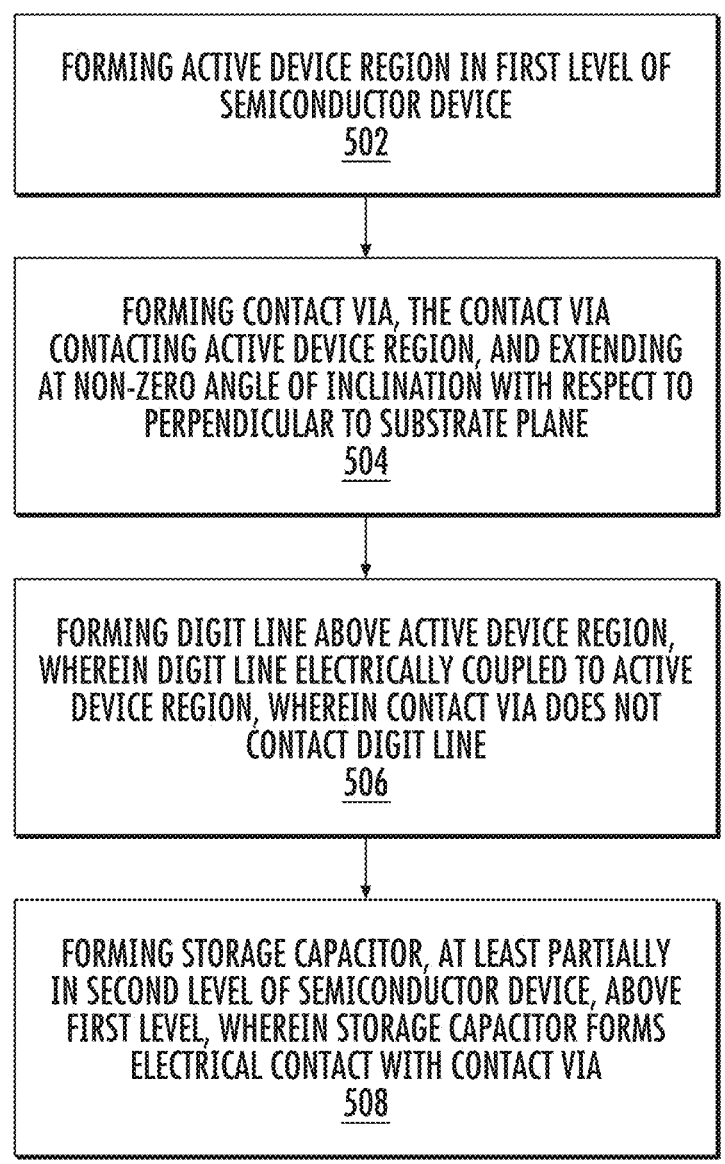
FIG. 5 shows an exemplary process flow, according to further embodiments of the disclosure.

FIG. 5 depicts an exemplary process flow 500, according to embodiments of the disclosure. At block 502, an active device region is formed in a first level of a semiconductor device, such as in a DRAM structure. At block 504, a contact via is formed, where the contact via contacts the active device region and extends at a non-zero angle of incidence with respect to a perpendicular to a substrate plane. At block 506, a digit line is formed above the active device region, where the digit line is electrically coupled to the active device region, wherein the contact via does not contact the digit line. Notably, the contact via may extend through multiple levels. At block 508, a storage capacitor is formed, at least partially in a second level of the semiconductor device, above the first level, wherein the storage capacitor forms electrical contact with the contact via.

The present embodiments provide various advantages over known device structures including memory device such as DRAM devices. For one advantage, the use of angled vias allows the contact area between different device structures to be increased for device structures disposed in different levels not aligned with one another, such as memory structures where a storage capacitor is not aligned directly above an active device region. Thus, using an angled contact via, an entirety of a top portion of the contact via may overlap with a storage capacitor while an entirety of a bottom portion of the contact via overlaps with the active device region. Another advantage is the flexibility in placement of a first device structure in a first level with respect to the placement of a second device structure in a second level. For example, a storage capacitor in a capacitor level may be shifted in an X-Y plane with respect to an active device region in an active level, since a contact via connecting the storage capacitor and active device region may compensate for the shift by virtue of the angle of the contact via.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, while those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A memory device, comprising:
   an active device region, comprising a first active area row and a second active area row, disposed at least partially in a first level;
   a first storage capacitor, arranged in a capacitor row, and a second storage capacitor, arranged in the capacitor row, the first storage capacitor and the second storage capacitor being disposed at least partially in a second level, above the first level, wherein the first level and the second level are parallel to a substrate plane;
   a first contact via, the first contact via extending between the first storage capacitor and the first active area row, and defining a first non-zero angle of inclination with respect to a perpendicular to the substrate plane; and
   a second contact via, the second contact via extending between the second storage capacitor and the second active area row, and defining a second non-zero angle of inclination with respect to the perpendicular to the substrate plane,
   wherein the first contact via is angled in a first direction, and
   wherein the second contact via is angled in a second direction, different from the first direction.

2. The memory device of claim 1, wherein the first storage capacitor forms incomplete overlap with the active device region within the substrate plane from a plan view perspective.

3. The memory device of claim 1, wherein the first storage capacitor forms no overlap with the active device region within the substrate plane from a plan view perspective.

4. The memory device of claim 1, wherein an entirety of a bottom portion of the first contact via overlaps with the active device region.

5. The memory device of claim 1, wherein an entirety of a top portion of the first contact via overlaps with the first storage capacitor.

6. The memory device of claim 1, wherein the first non-zero angle of inclination is less than 15 degrees.

7. The memory device of claim 1, wherein the active device region and the first storage capacitor and the second storage capacitor form a portion of a dynamic random-access memory (DRAM) cell.

8. The memory device of claim 7, wherein the DRAM cell forms a portion of a DRAM device, wherein the DRAM device comprises a $6F^2$ structure.

9. The memory device of claim 1, wherein the first contact via is disposed at least partially in a third level, the third level extending between the first level and the second level.

10. The memory device of claim 1, wherein the active device region and the first storage capacitor and the second storage capacitor form a portion of a dynamic random-access memory (DRAM) cell, wherein the first contact via extends through a digit line level of the DRAM cell including a digit line.

11. A device structure, comprising:
    a first device arranged in a first device row and a third device, arranged in a second device row, the first device and the third device being disposed in a first device level;
    a second device arranged in a third device row and a fourth device arranged in the third device row, the second device and the fourth device being disposed in a second device level, above the first device level;
    a first contact via, the first contact via extending between the first device and the second device, and defining a first non-zero angle of inclination with respect to a perpendicular to a substrate plane; and
    a second contact via, the second contact via extending between the third device and the fourth device, and defining a second non-zero angle of inclination with respect to the perpendicular to the substrate plane,
    wherein the first contact via is angled in a first direction, and
    wherein the second contact via is angled in a second direction, different from the first direction.

12. The device structure of claim 11, wherein the first device does not overlap the second device as viewed in plan view within the substrate plane.

* * * * *